United States Patent [19]

Delabastita

[11] Patent Number: 5,155,599
[45] Date of Patent: Oct. 13, 1992

[54] SCREENING SYSTEM AND METHOD FOR COLOR REPRODUCTION IN OFFSET PRINTING

[75] Inventor: Paul A. Delabastita, Boston, Mass.
[73] Assignee: Miles, Inc., Wilmington, Mass.
[21] Appl. No.: 735,644
[22] Filed: Jul. 25, 1991
[51] Int. Cl.⁵ .......... H04N 1/23; H04N 1/40; H04N 1/46
[52] U.S. Cl. .......... 358/298; 358/75; 358/454
[58] Field of Search .......... 358/298, 75, 454, 80

[56] References Cited

U.S. PATENT DOCUMENTS

| | | | |
|---|---|---|---|
| 4,293,873 | 10/1981 | Barendregt | 358/75 |
| 4,537,470 | 8/1985 | Schoppmeyer | 358/75 |
| 4,924,301 | 5/1990 | Surbrook | 358/75 |
| 5,045,931 | 9/1991 | Sakamoto | 358/75 |

Primary Examiner—Benjamin R. Fuller
Assistant Examiner—Scott A. Rogers
Attorney, Agent, or Firm—Richard J. Birch

[57] ABSTRACT

A screening system and method are disclosed for reproduction of images in printing. The screening angles that are used are close, but not identical to conventional screening angles. The reproduction is nevertheless Moire free by the fact that the deviations in angles from the conventional system are exactly offset by the deviations in line rulings. The screening system is particularly advantageous when used for combinations of screens with rational tangent angles. The Moire free combination of rational tangent screens can be rotated by a constant angle with the amount of rotation controlled in small increments.

11 Claims, 10 Drawing Sheets

SCREENING SYSTEM AND METHOD FOR COLOR REPRODUCTION IN OFFSET PRINTING

BACKGROUND OF THE INVENTION

The present invention relates to screening systems in general and, more particularly, to a second order Moire free screening system and method.

Offset printing is a binary process: the press can print INK or NO INK on a particular location of the paper. Unlike in the photographic or other "contone" reproduction processes, no controlled modulation of the ink density is possible to obtain the various shades of tone and color.

To simulate the effect of different densities, necessary for the reproduction of pictures, patterns of dots are used of which the SIZE is modulated. 0% dot size corresponds with no ink, while 100% dot size corresponds with a solid ink area. The process of simulating densities by modulating dot sizes is called "halftoning".

The patterns of dots are defined by an angle (measured along the direction of the shortest line that connects two dot centers, a screen ruling (defined by the number of dot centers per measurement unit, measured in the direction of the screen angle), and the shape of the dots as they grow from 0% to 100% (usually controlled by a "spot function").

In conventional color printing, four inks are used: cyan, magenta, yellow and black. Every printable color is simulated by overprinting a particular combination of dot percentages of these four inks.

The angles and rulings of the dot patterns of these four inks are chosen with the following two considerations in mind:

1) In order to reduce the sensitivity of the color reproduction to registration errors, the relative position of the dots of the four inks has to be (pseudo) randomized.
2) It is known that geometrical patterns of dots interact with each other, and can give raise to new patterns that are referred to as "Moire". The dot patterns in color printing should be chosen not to give raise to disturbing Moire patterns.

In conventional technology, both of these two requirements are achieved by using dot patterns for the cyan, magenta and black inks that have exactly the same ruling, and by using angles that are exactly 30 and 60 degrees offset with respect to each other. The yellow ink is usually printed with a screen using the same ruling as the others, and an angle that is 15 degrees offset with respect to one of the other inks. A combination of angles that works well is:
cyan: 75.0 degrees
black: 45.0 degrees
magenta: 15.0 degrees
yellow: 0.0 degrees It can be shown that if exactly these angles are used, the same relative position of the cyan, magenta and black dots is never repeated, which meets the first requirement, while the "Moire" is a "micro Moire" (often referred to as the "rosette"), which, when screen rulings are used of approximately 150 l/i, is small enough not to be disturbing.

Digital Screening Systems

General

Several methods have been developed in the past to generate halftone dot patterns on digital film recorders. A typical digital film recorder consists of a scanning laser beam exposing a photosensitive material at high resolution. Typically the "grid" that defines the resolution at which the laser beam can be modulated ON or OFF has a pitch in the range of 1/2400 of an inch. The digital screening algorithms have to turn ON or OFF the "micro dots" on the recorder grid so that they form clusters of microdots that make up the halftone dots, the size of which corresponds to the desired local density level.

Most digital screening algorithms make use of a thresholding mechanism to convert the contone pixel values into halftone micro dot on the recorder grid. The screen function values are arranged as a landscape of "mountains and valleys". The mountains correspond to the high screen function values, the valleys to the low screen function values. The actual shape of this landscape is controlled by the "spot function". FIG. 1 demonstrates this with a one dimensional model.

At the time of the screening, the screen function values are compared: dot-by-dot and line-by-line on the recorder grid with the pixel values of the image to be halftoned. If the screen function value is higher than the pixel value at that location on the recorder grid, the laser beam will be modulated "on", and will create a black microdot on the film. Because of the arrangement of the screen function values, SMALL clusters of halftone dots will occur on the film at light parts of the image, while LARGE clusters of microdots will appear at the dark parts of the original image. In this way, the lightness information of the pixels in the original image is transformed into halftone dots with a corresponding size.

As was suggested before, the arrangement of the screen function values controls exactly how the dots grow from small to large for decreasing lightness levels of the pixels. The arrangement also controls the relative position (ruling and angle) of centers of the halftone dots. It turns out that the distinction between most halftoning algorithms can be made in the way that the screen function values are obtained at the time of screening. Some algorithms perform all the mathematical evaluations to obtain the proper screen function value for every element of the recorder grid on the fly; other algorithms do the calculations off line, store the results in a matrix, and just call the prestored values in the appropriate order at the time of the screening itself.

"Simple" Rational Tangent Screening

FIG. 2 explains how the most elementary form of "rational tangent screening" works. The threshold values are precalculated off line for one dot and stored in a square matrix. The size of the matrix determines the size of the dots that it will generate. At the time of the screening, the matrix elements are called in a certain order and used to halftone the contone data. The operation is equivalent to the placement and replication of the matrix elements under the screening angle on the recorder grid.

The frequency and angle of such a screen is given by (see FIG. 2):
alfa = arctan(A/B);
freq = res/sqrt(A*A + B*B);

res: resolution.

Since every dot in this method is obtained from the replication of one and the same matrix on the recorder grid, it is a requirement for this method to work that the 4 corners of the matrix be coincident with points of the recorder grid. This explains why the method is called "rational tangent", because the arctangent of the angles it produces is always equal to the ratio of the two integer numbers A and B. This has serious implications with respect to the number of rulings and angles that can be generated with this method, and the accuracy by which the conventional angles and rulings can be approximated.

FIG. 3 demonstrates that, especially for small cells (a), the angle of replication cannot be precisely controlled. (The angular accuracy becomes better, when the tile is larger. In the field of color printing, it has proven to be difficult to achieve combinations of angles and rulings for the cyan, magenta and black separations that result in Moire free color reproduction. U.S. Pat. Nos. 3,657,472, 4,084,183, 4,443,060 and 4,537,470 all contain suggestions on how to reduce the problems that occur in printing when combinations of these screens are used.

In the "preferred embodiment" of U.S. Pat. No. 4,084,183 it is explained that, if small congruent parcels for the four screens ar used, a repeating micro structure is obtained, that, not unlike the conventional rosette, will not be disturbing to the eye.

Rational Tangent Screening using a "Supercell"

An improvement of rational tangent screening is obtained by making use of "supercells" that, instead of containing only one dot, contain "m" dots horizontally and vertically. In that case, it is only required that the four corner points of the SUPERCELL fall on the recorder grid, rather than the four corner points of every individual dot. Since the size of "supercell" is larger than an individual dot, a higher precision can be achieved in approximating the conventional angles. The method is demonstrated in FIG. 4. It is to be noted that the angles that are obtained are still "rational tangent angles", since their arctangent is still equal to the ratio of two integer numbers A and B.

Frequencies and angles of the screen obtained with this algorithm are given by:
alfa = arctan(A/B);
freq = m*res/sqrt(A*A + B*B);

res: resolution.
m: multiplicity.

"Irrational tangent" screening

In order to minimize Moire in color reproduction, much effort has been spent in the past to develop screening algorithms that are able to approximate the conventional screening angles with very high precision. These algorithms are generally referred to as "irrational tangent screening algorithms", since the goal of these algorithms is to approximate the 15 and 75 degree angles (which have an irrational tangent) with the highest possible precision. Most of these algorithms produce screen function values by sampling one period of the spot function under a given angle and at a certain frequency. This technique is shown in FIG. 5. The sampling angle and frequency determine the angle and ruling of the screen that will be obtained. It can be shown that, if the tangent of sampling angle is truly an irrational number (i.e. cannot be expressed as the ratio of two integer numbers), the same xy position in the screen function period will never be sampled twice.

There are two classes of implementations possible for these irrational tangent screening algorithms. In the first implementation, the value of the sample in the screen function period is evaluated on the fly. Since this mathematical evaluation has to be done fast, special hardware is usually necessary to achieve the required speed. The method is also limited to spot functions that don't require too much calculations. U.S. Pat. No. 4,419,690 describes a possible implementation.

Another approach comprises precalculating the screen function values of one period, and storing them in a two dimensional matrix, the size of which is typically 32×32 or 64×64 elements. Sampling the screen function period can be done by picking the precalculated matrix element that lies closest to the xy position of the sample point. However, in order to reduce artifacts that result from periodic rounding off effects in addressing the matrix, noise is usually added to the xy position coordinates of the samples, and special averaging techniques have to be used. These techniques are described in U.S. Pat. Nos. 4,449,489, 4,456,924, 4,700,235 and 4,918,622. These special averaging techniques make the implementation of irrational tangent screening algorithms relatively complex and expensive.

Moire analysis of existing screening systems

Having described these screening systems, their performance in color printing will be described after a brief introduction on a technique for analysing Moire in color printing.

Principle of Moire analysis

The interaction between the frequencies and angles of the rasters in color reproduction can best be studied by means of vector diagrams in the "frequency domain". Every dot raster can be represented by two orthogonal vectors with their length corresponding to the frequency of the screen, and their angle corresponding to the angle of the raster. The effect of the "harmonic frequencies" of the rasters is omitted.

The interactions between two or more rasters correspond to all possible combinations of sum and differences of the original vectors.

It has been experimentally verified that in color printing, the single most important source of Moire is associated with the second order Moire (*) resulting from the superimposition of the cyan, magenta and black rasters. The goal in color reproduction is to obtain a Moire period from these rasters that is INFINITELY large. FIG. 6 shows that this is indeed the case when conventional screening is used. The sum of the 15 degree magenta component and the 135 degree black component coincides exactly with the 75 degree cyan component, resulting in a zero frequency (and hence an infinite period) for the Moire. Similarly, the sum of the 45 degree black component and the 165 degree cyan component coincides exactly with the 105 degree magenta component. With formulas, the equations are:

$$C = M\_5 + K\_35;$$

$$M\_105 = K\_45 + C\_165;$$

FIG. 7 demonstrates what happens if one of the separations, for example the black, is off register. As can be seen, the sum of the 15 degree magenta and 135 degree black does not coincide with the 75 degree cyan vector. The "second order Moire" does not have a zero frequency in this case, and a periodical pattern will be created, the angle and period of which correspond to the difference vector. It should be understood that as used herein, the term "Second Order Moire" means the Moire as a result of the interaction between an original component (for example the "cyan"), and a component that is already the result of an interaction between two other original components (for example magenta and black).

The vector diagram in FIG. 6 only shows the relation between the lengths and angles of the frequency vectors. In addition to these relations, there is also the relative phase of the three rasters. The relative phase of the three rasters will have an effect on the average overlap between the halftone dots, and will determine what kind of rosette is obtained. FIG. 8A shows a Moire free combination of three rasters (15, 45 and 75 degrees) in a particular phase relation. FIG. 8B shows the same set of rasters, but the 45 degree screen is half a period shifted in phase. As can be seen, the "rosette" structure is different in both cases. It is believed that the rosette structure of FIG. 8A is the preferable one, because it looks less coarse to the eye when seen from a distance, and because it preserves the gradation better in the shadows. FIG. 9 shows a case of Moire. The relative phase between the sum of the 15 and 75 degree rasters changes continuously, resulting in a shifting rosette. The shortest distance of one complete cycle from onekind of a rosette, to another kind and back to the first kind corresponds to the Moire period, that would be found from the corresponding vector diagram.

In most practical cases, there is enough symmetry in the generation of a set of screens that it is sufficient to mathematically investigate only one of the two second order Moires. FIG. 6 in that case can be replaced by the simplified diagram in FIG. 10, which shows a triangle. If the triangle is "closed", there will be no second order Moire, if it is open, the second order Moire can be calculated from the sum of the three vectors. Mathematically this corresponds to:

M_x = F1*cos(alfa1) + F2*cos(90.0-alfa2) − F3*cos(alfa3);
M_y = F1*sin(alfa1) − F2*sin(90.0-alfa2) − F3*sin(alfa3);
M_period = 1.0/sqrt(M_x*M_x + M_y*M_y);

Moire Analysis for combinations of "rational tangent" screens

As mentioned before, it is impossible to obtain combinations of the rational tangent screens as they were presented before that cancel out second order Moire completely. The proof for the most common case, namely a set of three screens that are defined by two integer numbers "A" and "B" follows:
Given: A,B,res.
  screen1: alfa1 = arctan(A/B); F1 = res/sqrt(A*A+B*B);
  screen1: alfa1 = arctan(1.0); F2 = res/sqrt((A−B)*(A−B)+(A−B)*(A−B));
  screen3: alfa3 = arctan(B/A); F3 = F1;
An example of such a screen set is:
res = 2400 dpi, A = 4, B = 15.
By applying the formulas:
alfa1 = 14.9314 degrees; F1 = 154.5976
alfa2 = 45.0000 degrees; F2 = 154.2778
alfa3 = 75.0686 degrees; F3 = 154.5976

The endpoints of the vectors that correspond to screen1 and screen3 are:
endpoint screen1: (x0,y0) = (F1*cos(alfa1), F1*sin(alfa1))
endpoint screen3: (x1,y1)) = (F3*cos(alfa3), F3*sin(alfa3))

or, because: F1 = F3, cos(alfa3) = sin(alfa1), sin(alfa3) = cos(alfa1):

endpoint screen1: (x0,y0) = (F1*cos(alfa1), F1*sin(alfa1))
endpoint screen3: (x1,y1) = (F1*sin(alfa1), F1*cos(alfa1))

In order to have no Moire, the angle of the ideal frequency vector F2' should be 45.0 degrees, and its length should be the distance between the two endpoints of screen1 and screen3.

$$
\begin{aligned}
F2' &= \mathrm{sqrt}((x0-x1)*(x0-x1) + (y0-y1)*(y0-y1)) \\
&= F1*\mathrm{sqrt}(2.0 - 4*\cos(alfa1)*\sin(alfa1)) \\
&= F1*\mathrm{sqrt}(2.0 - 4*A*B/(A*A+B*B)) \\
&= F1*\mathrm{sqrt}((2*A*A + 2*B*B - 4*A*B)/(A*A+B*B))
\end{aligned}
$$

The real length of the frequency vector screen2 however is:

$$
\begin{aligned}
F2 &= \mathrm{res/sqrt}((A-B)*(A-B) + (A-B)*(A-B)); \\
&\quad F1*\mathrm{sqrt}(A*A+B*B)/\mathrm{sqrt}((A-B)*(A-B) + (A-B)*(A-B)); \\
&\quad F1*\mathrm{sqrt}((A*A+B*B)/(2*A*A + 2*B*B - 4*A*B))
\end{aligned}
$$

In order to have no second order Moire, it is required that F2 = F2'.

After working out this equation, the following condition is found
3*z*z*z*z − 16*z*z*z + 22*z*z − 16*z + 4 = 0
with: z = A/B;

This is a fourth degree polynomial in "A/B". The equation has two real roots:
z0 = 2.0 − sqrt(3.0);
z1 = 2.0 + sqrt(3.0);

Both are irrational numbers with arctangents 15.0 and 75.0 degrees, respectively. In other words, no two integer numbers A and B exist that can make the Moire period infinitely large.

The Moire period in the above example can be calculated and is 1.56 inches. This will be disturbing in most printing situations.

Moire Analysis of "Supercell" screening

By using multiple dot "supercells", the angular accuracy of the screens can be made considerably better. The Moire analysis of the "supercell" approach reveals that, although longer Moire periods can be obtained, it is also here, for the same reason as in the previous case, impossible to obtain completely Moire free results. An example is given:
Given:
  res = 2400; A = 15; B = 56; m = 3;
  sceen1: alfa1 = 14.9951; F1 = 124.1933;
  sceen1: alfa2 = 45.0000; F2 = 124.1748;
  sceen3: alfa3 = 75.0049; F3 = F1;
The Moire period in this case is 27.07 inches, considerably better than in the previous case.

Moire Analysis of "Irrational tangent screening"

The Moire analysis in the case of irrational tangent screening is quite simple. If a set of three screens is used that are exactly 30 degrees offset, and that have exactly the same rulings, the frequency diagram will show that the three vectors of the screens form an equilateral, closing triangle, and thus that there will be no Moire.

OBJECTS OF THE INVENTION

It is accordingly a general object of the invention to provide an improved screening system and method for printed reproduction of images.

It is a specific object of the invention to provide a screening system that eliminates second order Moire.

It is another object of the invention to provide a screening system that can utilize screen angles that are rational tangent angles.

It is still another object of the invention to provide a screening system that can utilize screen angles that are irrational tangent angles.

It is a further object of the invention to provide a method for producing halftone screen function values utilizing a rectangular "tile" having dots that are preangled under a rational tangent angle.

BRIEF DESCRIPTION OF THE INVENTION

The screening system for printed reproduction of images comprises three separation screens. The separation screens have different screen angles and each screen has rulings. At least two of the screen rulings are different and at least one vector sum of two frequency components of one pair of screens is equal to at least one of the frequency components of the other screen or of a multiple or submultiple of the at least one frequency component. Screen angles that are offset by thirty degrees or a multiple thereof and in which the vector lengths of the frequency components are identical are excluded.

BRIEF DESCRIPTION OF THE DRAWINGS

The objects and features of the present invention will best be understood from a detailed description of a preferred embodiment thereof selected for purposes of illustration and shown in the accompanying drawings, in which.

DETAILED DESCRIPTION OF A PREFERRED EMBODIMENT OF THE INVENTION

Figure 11:
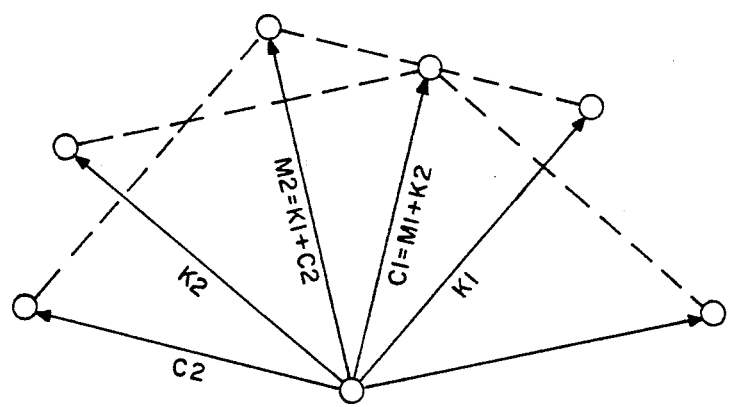
FIG. 11 is a vector diagram illustrating the screening system of the present invention that produces zero second order Moire.
Figure 8B:
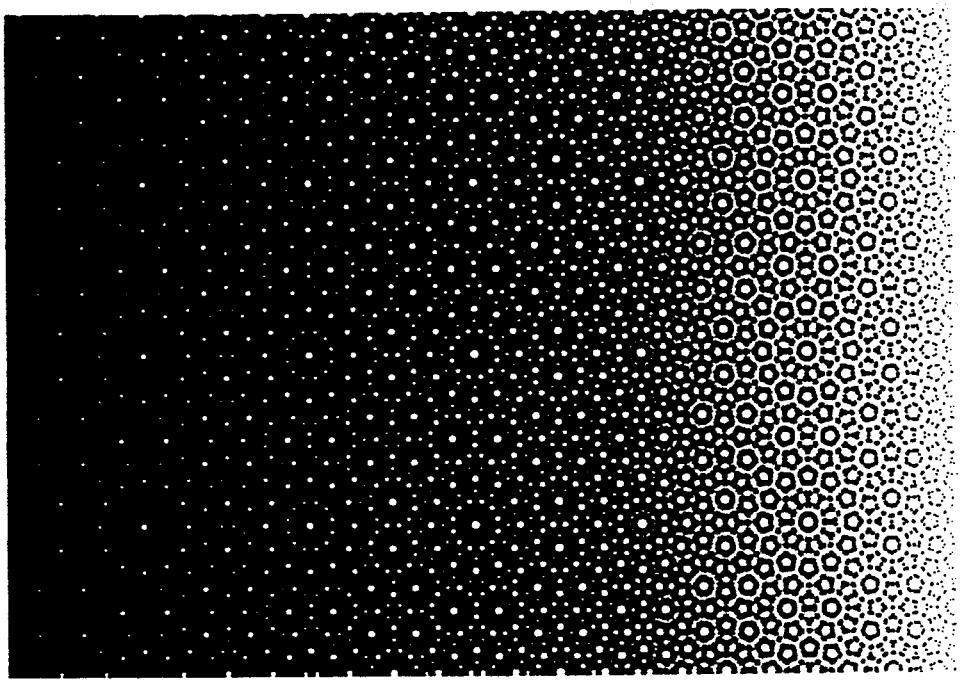
FIG. 8(b) depicts the result of having offset the 45 degree raster over half a period which yields a clear centered rosette.
Figure 8A:
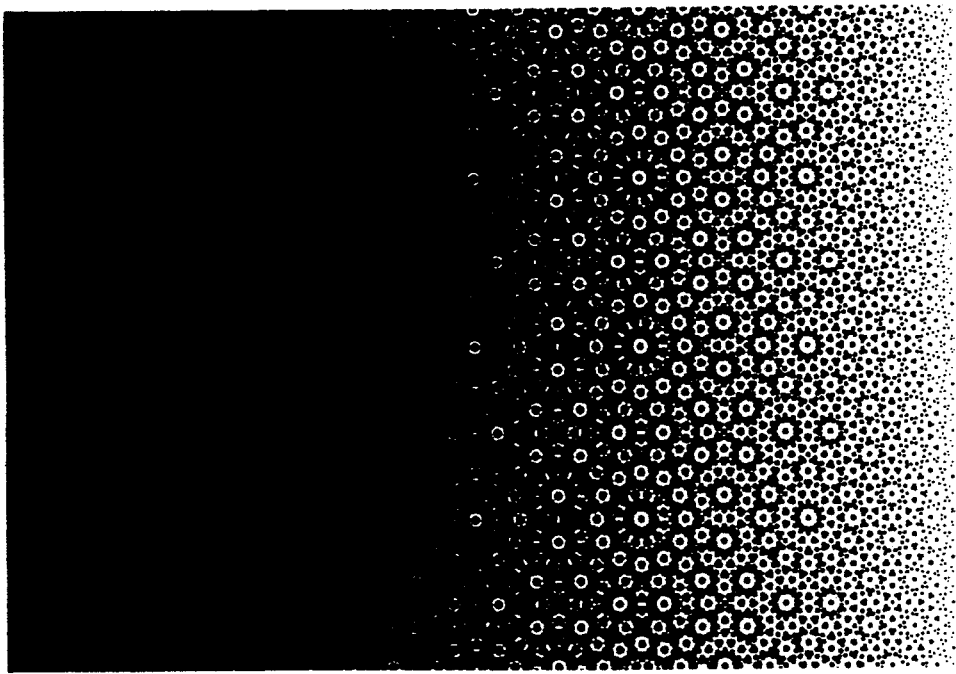
FIG. 8(a) is an image created by the superposition of three degradees from 0% to 90% rastered at 15, 45 and 75 degrees with identical rulings which produces a dot centered rosette.
Figure 9:
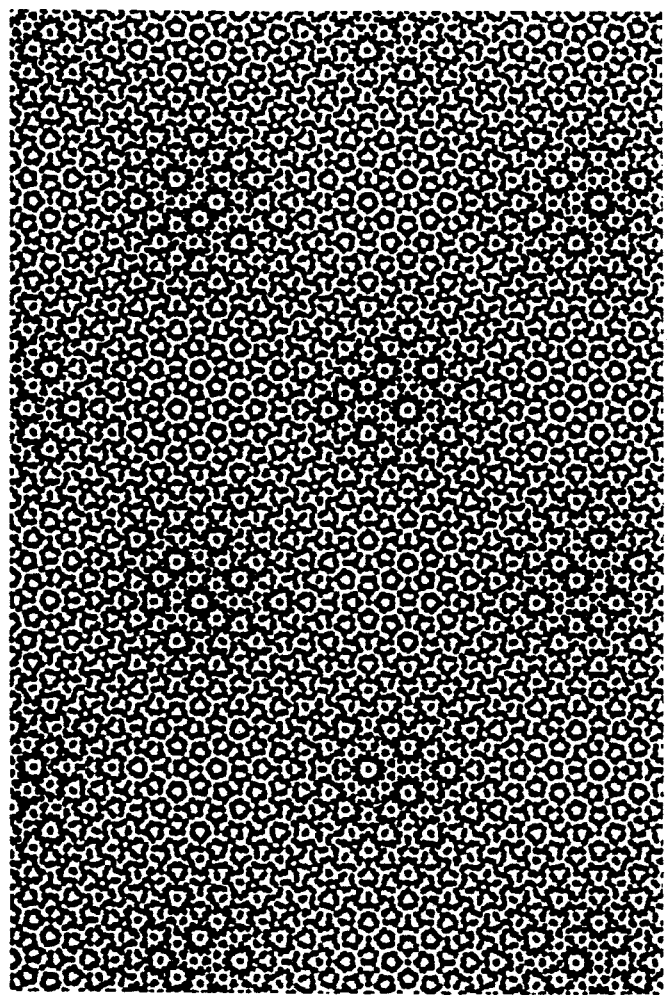
FIG. 9 illustrates the Moire produced by the interaction of three rasters with angles of 15, 45 and 75 degrees with slightly different rulings.

Having analyzed that the absence of Moire in conventional screening systems is explained by the fact that in the frequency domain the sum of the frequency components of one pair of screens exactly coincides with a component of the third screen, "second order Moire" also can be completely cancelled out in the case of non conventional screening systems. FIG. 11 shows a case where the rulings of the three screen sets are non-identical, yet, by an appropriate selection of the angles, it is possible to obtain exactly the same conditions as in the conventional technology to cancel out the second order Moire. If the deviations in angle and ruling from the conventional case are small (equal to or less than 1.0 degree and preferably equal to or less than 0.5 degree), screening results can be obtained that are virtually indistinguishable from the results obtained with conventional screening, when it comes to Moire, rosette structure, printability and overall microscopic and macroscopic appearance.

It also is possible to cancel out second order Moire in this way, if particular combinations of RATIONAL TANGENT screens are used. This is significant, since other methods that use rational tangent screens are not completely free of second order Moire as was demonstrated, while the methods that generate "irrational tangent" screens are more complex and more expensive in implementation.

Figure 12:
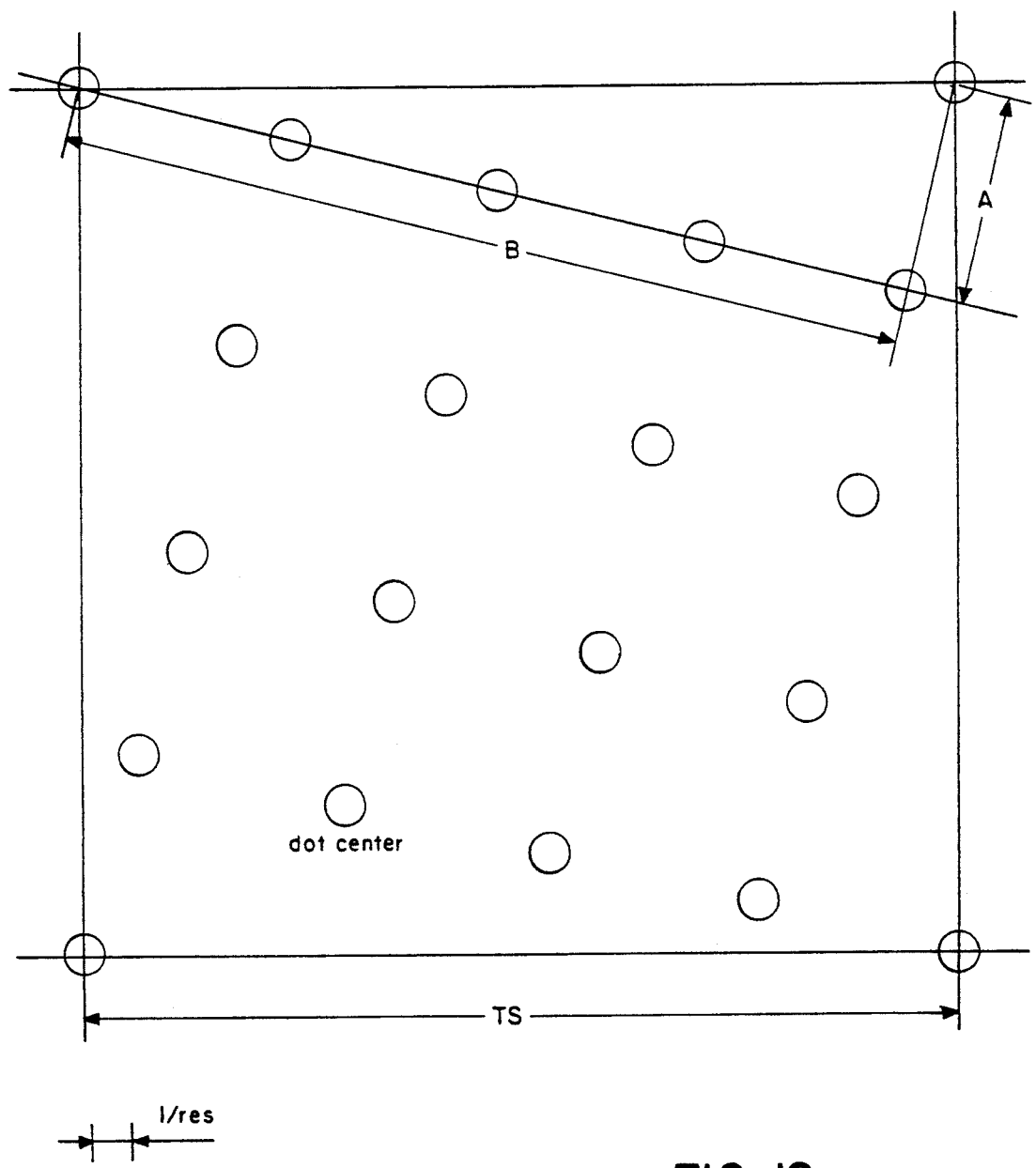
FIG. 12 is a diagram illustrating the geometry of a cell with preangled dots in accordance with the present invention.

FIG. 12 shows the geometry of a cell with multiple preangled dots. The angle of the screen that such a tile generates is determined by the ratio of the two integer numbers A and B. The period of the screen is proportional to the size of the tile. The following relations can be immediately derived from the FIG. 12:

alfa: screen angle;
Period: screen period in inches;
TS: tilesize expressed in number of recorder dots.
res: recorder resolution expressed in dots/inch.

alfa = arctan(A/B);
TS*(1/res) = Period*sqrt(A*A + B*B);
The following relations can also be derived from the previous:
freq: line ruling of the screen;
shades: average number of recorder elements per dot;
dots: number of dots that the tile contains.

freq = res*sqrt(A*A + B*B)/TS;
shades = TS*TS/(A*A + B*B);
dots = A*A + B*B.

Figure 1:
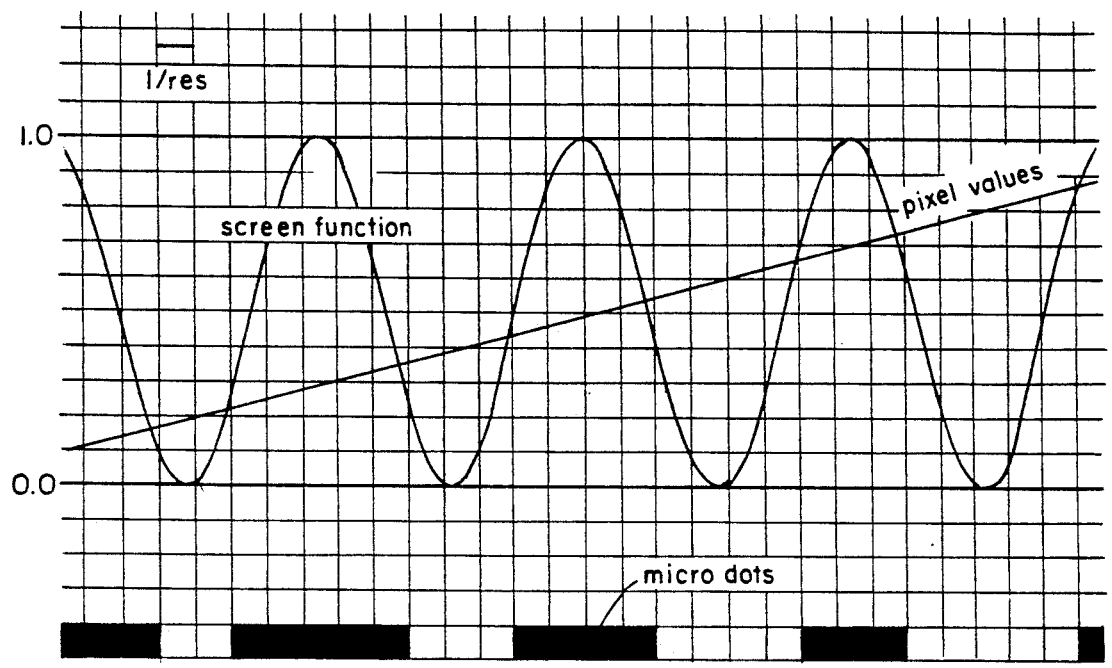
FIG. 1 is a diagrammatic one dimensional model of prior art electronic screening.
Figure 2:
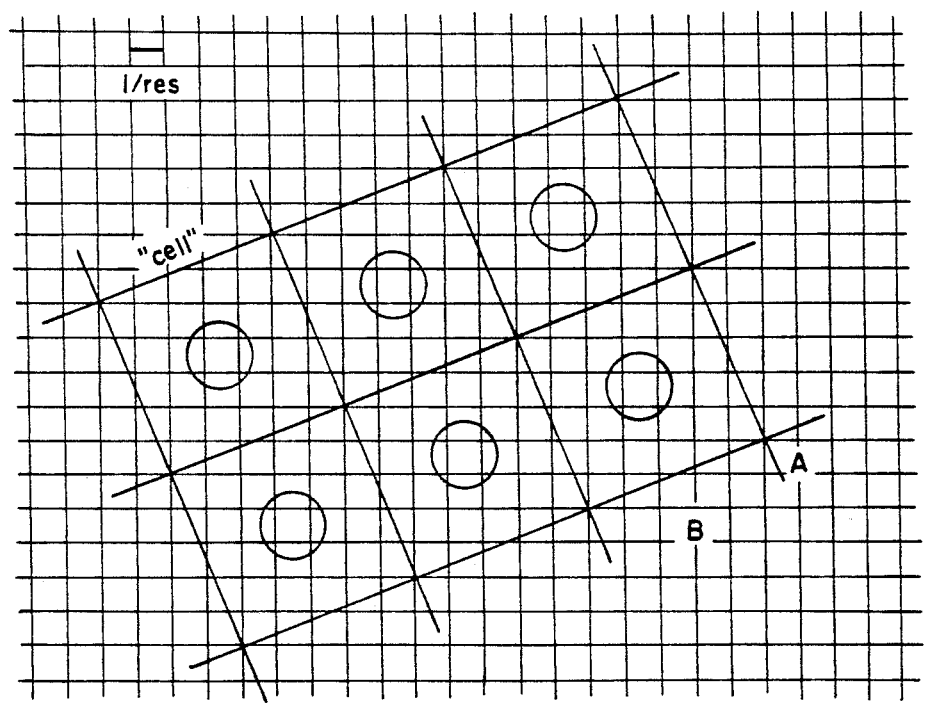
FIG. 2 is a diagram illustrating the principle of prior art rational tangent screening.
Figure 3:
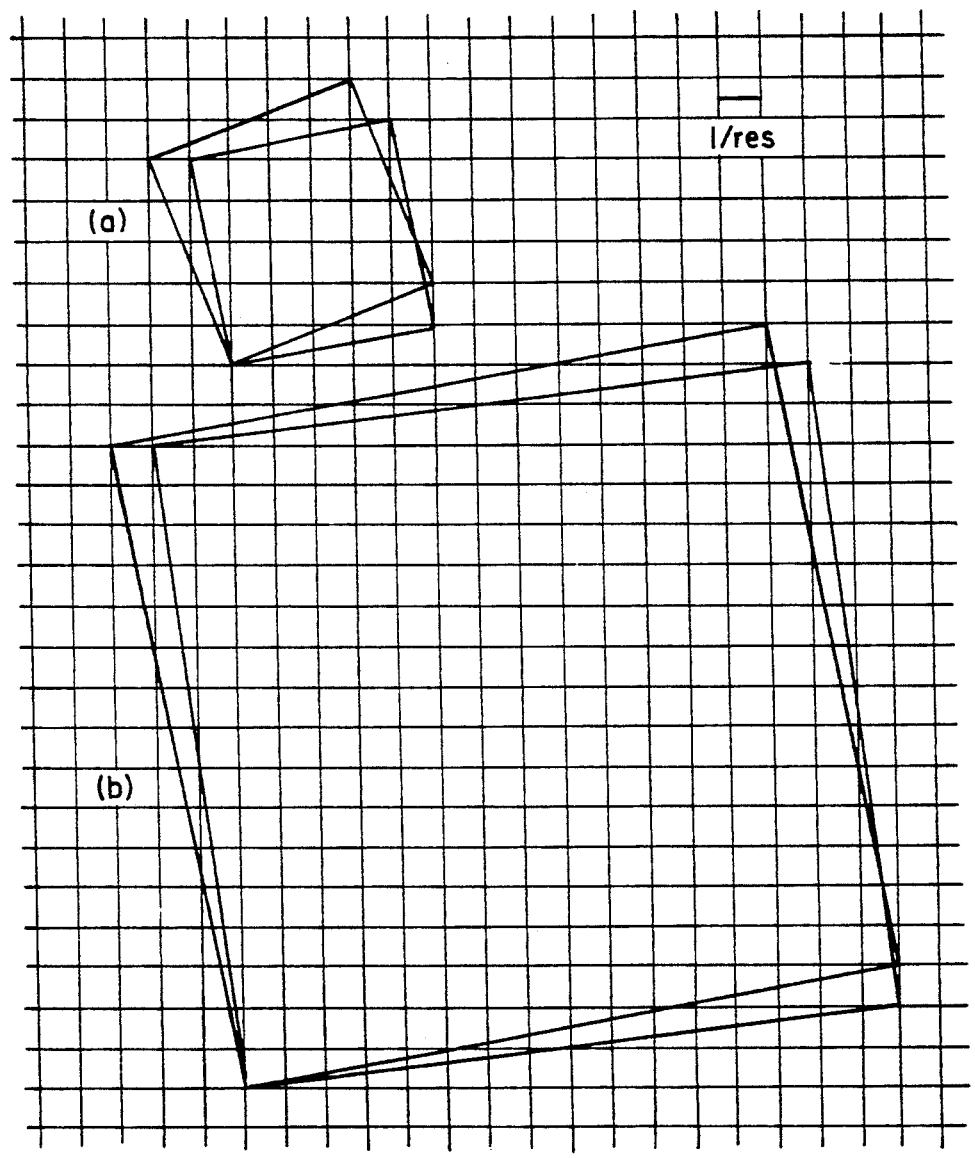
FIG. 3 is a diagram illustrating the achievable angular accuracy with prior art small and large cell sizes.
Figure 5:
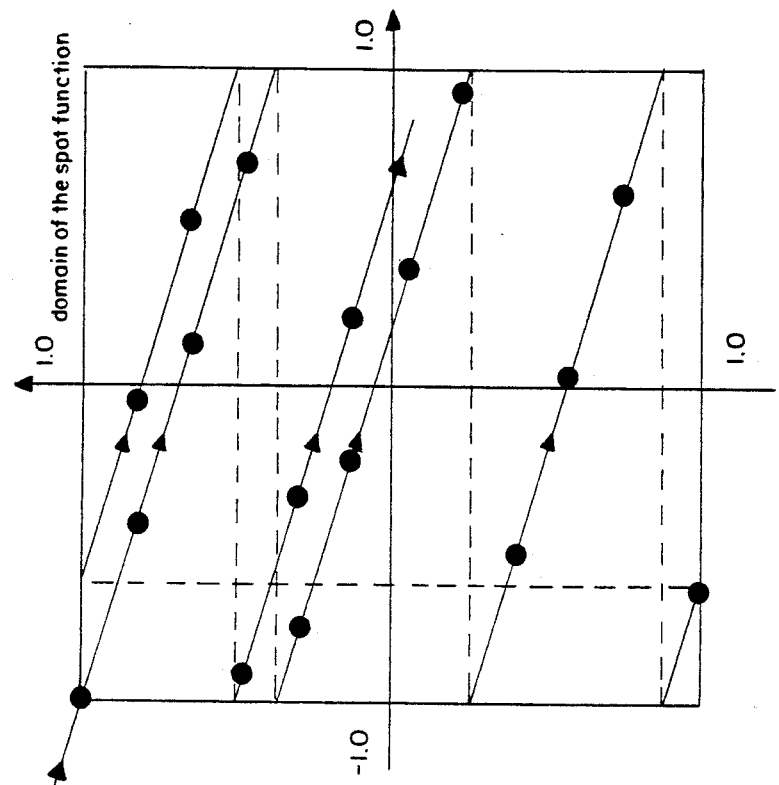
FIG. 5 is a diagram illustrating the principle of the prior art irrational tangent screening process.
Figure 4:
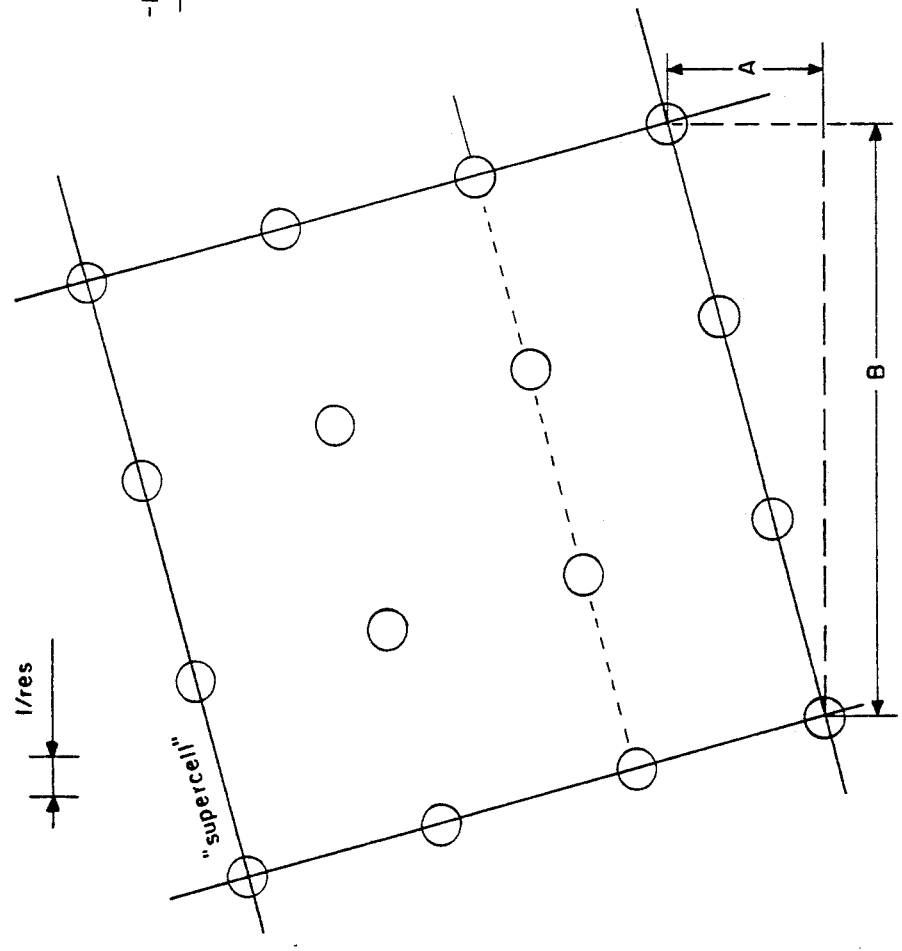
FIG. 4 is a diagram illustrating the prior art rational tangent screening with a "supercell"
Figure 6:
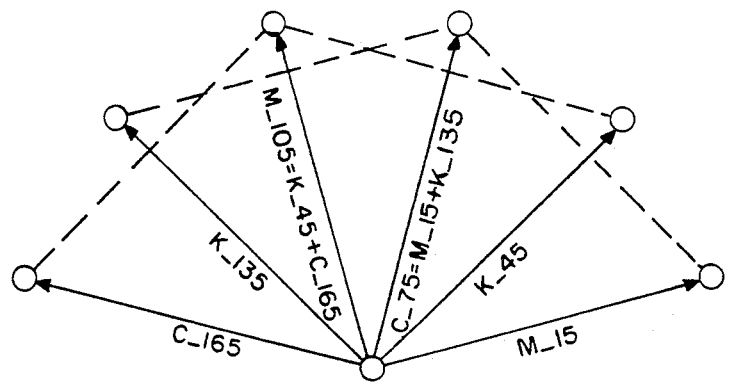
FIG. 6 is a vector diagram illustrating the interaction of three rasters at 15, 45 and 75 degrees with identical rulings to achieve no Moire.
Figure 7:
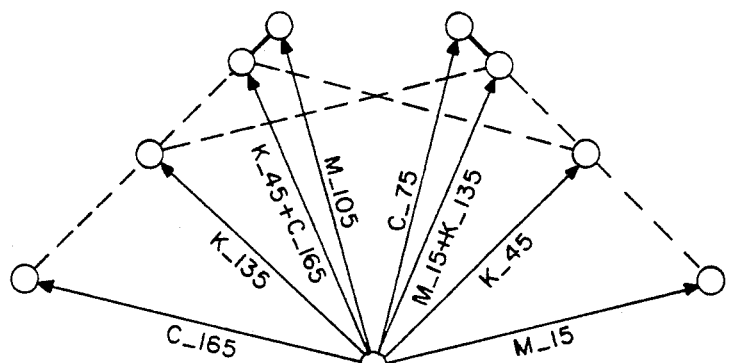
FIG. 7 is another vector diagram illustrating the production of Moire as a result of the interaction of three rasters at 15, 50 and 75 degrees with non-identical rulings.
Figure 10:
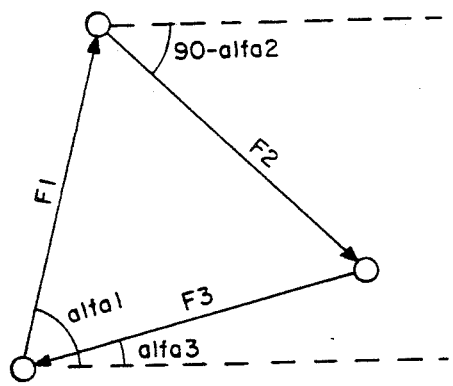
FIG. 10 is a simplified vector diagram illustrating the interaction of orthogonal screens.

The tile in FIG. 12 can be seen as one screen period that, if replicated horizontally and vertically creates a contiguous screen. It is emphasized that the way of creating a rational tangent screen here is fundamentally different from the method described in FIG. 4: In FIG. 4, a cell with multiple dots, angled parallel to the cell boundary, is replicated under a rational tangent angle, while in FIG. 12, a cell with preangled dots is replicated horizontally and vertically. There is a certain symmetry when both techniques are compared.

It should also be clear that, if the parameters TS, A and B are all multiplied or can be divided by the same integer number, equivalent sets of tiles are obtained which will produce the same angles and rulings.

Moire free combinations of tiles

It is possible to combine screens obtained from "tiles" as above that produce results that are completely Moire free, and that are indistinguishable from the traditional screening systems. The conditions to obtain such screening systems can be summarized as follows:
1) The tilesizes TS of all the three screens are the same.
2) The first screen is defined by two integer numbers A and B, and has an angle alfa1 = arctan(A/B);
3) The second screen is defined by two integer numbers C and D, and has an angle alfa2 = arctan(C/D);
4) The third screen is defined by two integer numbers E = (B−D) and D = (C−A), and has an angle alfa3 = arctan((B−D)/(C−A));
5) The difference between alfa1 and alfa3 is 30 degrees ±0.5 degrees.
6) The difference between alfa2 and alfa3 is 30 degrees ±0.5 degrees.
7) The rulings of the three screens are the same within ±2.0%.
8) If two integer numbers X and Y that define the angle of a tile have a common divisor, the parameters TS, X and Y may be replaced by their original values divided by the common divisor.
9) The integer numbers TS, X, Y that define any of these screens can be multiplied by any integer number, since this results in an equivalent tile.

An example of such a screen system is:
res = 2400 dpi;
screen1: TS1 = 627; A = 11; B = 33;
screen2: TS2 = 627; C = 34; D = 7;
screen3: TS3 = 627; E = 26; F = 23;
This screening system is equivalent to the following screening system:
screen1: TS1 = 57; A = 1; B = 3;
screen2: TS2 = 627; C = 34; D = 7;
screen3: TS3 = 627; E = 26; F = 23;
If the formulas for screening angle and ruling are applied on these screening parameters, the following results are obtained:
screen1: alfa1 = 18.4349 degrees; freq1 = 133.1485 l/i.
screen2: alfa2 = 78.3554 degrees; freq2 = 132.8731 l/i.
screen3: alfa3 = 48.5035 degrees; freq3 = 132.8731 l/i.
Using these values in the formulas to calculate the Moire period, produces:
Moire_x = 0.0;
Moire_y = 0.0;
M_period = infinite.
This means that this combination of screens, although different from the conventional case, and each of them having a rational tangent, is completely Moire free.

Mathematical proof of the absence of "second order Moire"

The proof that screen sets in general that meet the requirements stated above are free from "second order Moire" follows.

Figure 13:
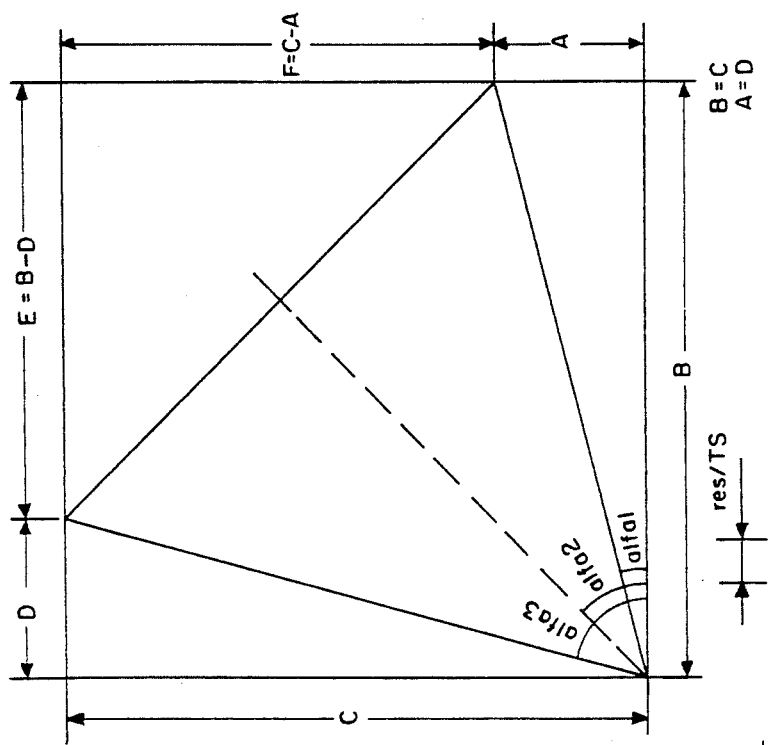
FIG. 13 is a vector diagram for Moire analysis showing that when the three vectors form a closed triangle, second order Moire is eliminated.

Given a set of three screens obtained from the same tilesize TS, and with rational tangent angles defined by the following pairs of integers:
screen1: A,B;
screen2: E,F;
screen3: C,D;
with E = B − D; F = C − A;
The angles of the screens that these tiles generate are of course:
screen1: alfa1 = arctan(A/B);
screen2: alfa2 = arctan(E/F);
screen3: alfa3 = arctan(C/D);
And the frequencies are:
screen1: freq1 = res*sqrt(A*A + B*B)/TS;
screen2: freq2 = res*sqrt(E*E + F*F)/TS;
screen3: freq3 = res*sqrt(C*C + D*D)/TS;

FIG. 13 shows the vector diagram that corresponds to this screening system, with a rectangular frame around it. The "unit of length" in the drawing is equal to res/TS. Since B = E + D and C = F + A, the triangle of the three vectors closes, and the screening system is indeed, despite the fact that it consists of rational tangent screens, free from any "second order Moire".

Calculation of the parameters specified in FIGS. 12 and 13 is performed by the following program:

```
#include <math.h>
#include <stdio.h>
#define IMAX 10000
/*CALCULATE OPTIMAL PARAMETERS*/
/*Parameters: angle "alfa1" and frequency "freq" of the first
screen of a Moire free set, and angular tolerance "atol" to
approximate the angles. The program returns parameters
"TS,A,B,C,D,E and F" as specified in FIGS. 12 and 13.*/
calc_par(alfa1,freq,atol,res,TS,A,B,C,D,E,F)
double alfa1,atol,freq,res;
int *TS,*A,*B,*C,*D,*E,*F;
{
int dum1,dum2,n1,n2
double ftol,PI,alfa3,x;
PI = 2.0*acos(0.0);
ftol = 1.0−2.0*cos(PI/3.0 + atol);
ratio_approx(tan(alfa1),atol,A,B);
alfa3 = alfa1 + PI/3.0;
ratio_approx(1.0/tan(alfa3),atol,D,C);
x = sqrt((double) ((*A)*(*A) + (*B)*(*B))/((*C)*(*C) + (*D)*(*D)));
ratio_approx(x,ftol,&n2,&n1);
*A = n1*(*A);
*B = n1*(*B);
*C = n2*(*C);
*D = n2*(*D);
*E = (*B) − (*D);
*F = (*C) − (*A);
*TS = res*sqrt((double) (*E)*(*E) + (*F)*(*F))/freq + 0.5;
}
/*RATIO APPROXIMATION*/
/*Parameters:"x" and "tol".Results:two numbers "i" and "j", the
```

-continued

```
ratio of which approximates "x" with a tolerance "tol".*/
ratio_approx(x,tol,i,j)
double x,tol;
int*i,*j;
{
*j=1;
for((*i)=1;(*i)<IMAX;(*i)++)
    {
    *j = (int) ((double) (*i)/x+0.5);
    if(fabs((double) (*i)/(*j)−x)<tol)return;
    }
{
/*MAIN*/
/*main program*/
main()
{
double alfal,atol,PI,freq,res;
int i,j,A,B,C,D,E,F,TS;
PI = 2.0*acos(0.0);
res = 2400.0;
while(l)
    {
    printf("Enter angle and frequency of screen:");
    scanf("%lf %lf",&alfal,&freq);
    printf("angular tolerance:");
    scanf("%lf",&atol);
    alfal = PI*alfal/180.0;
    atol = PI*atol/180.0;
    calc_par(alfal,freq,atol,res,&ts,&A,&B,&C,&D,&E,&F);
    printf("TS: %d; ab: %d %d cd:
    %d %d ef: %d %d0,ts,A,B,C,D,E,F);
    }
}
```

The actual production of the screens can be performed using the teachings of U.S. Pat. No. 4,700,235, the subject matter of which is incorporated herein by reference.

It was explained previously that in the "supercell" rational tangent screening method, the dots are oriented parallel to the cell boundary, and that it is the cell itself that is placed and replicated across the recorder grid (see FIG. 4), while in the present "tile" method, the cell contains preangled dots, and is placed and replicated horizontally and vertically (see FIG. 12).

Figure 14:
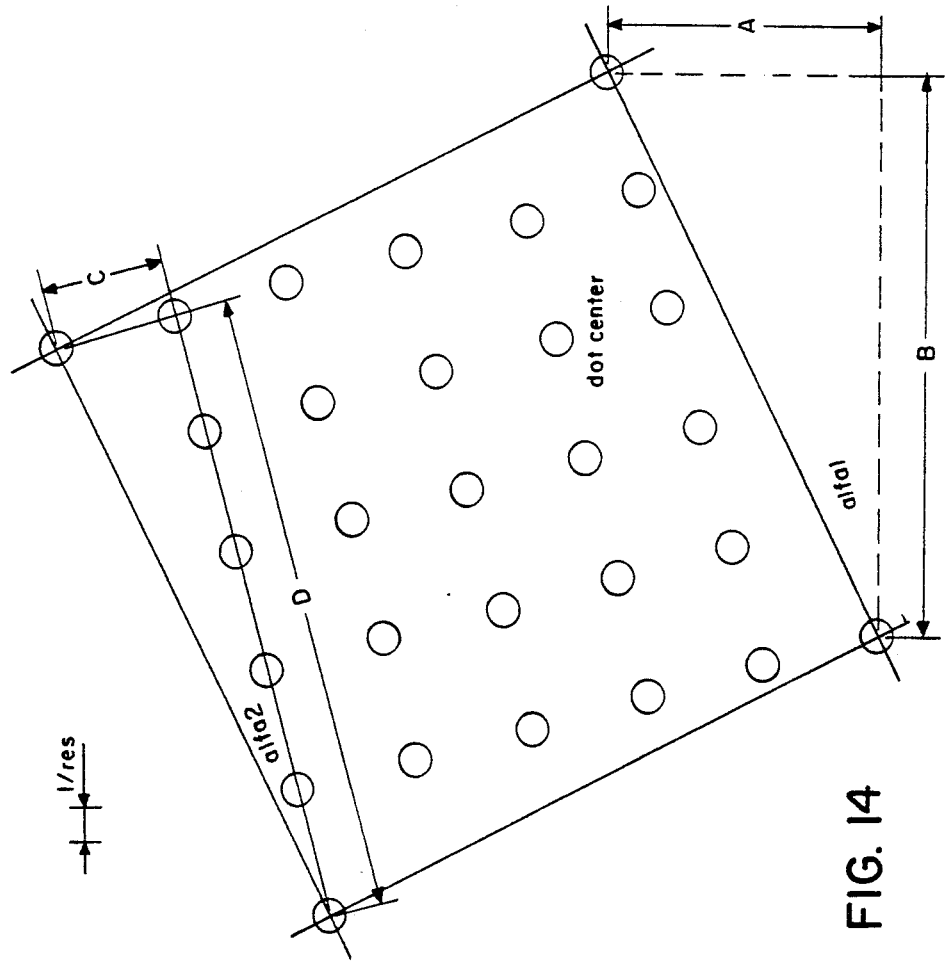
FIG. 14 is a diagram showing a preangled tile, placed and replicated under a rational tangent angle.

There is no reason why both methods cannot be combined. The geometry that is obtained in that case is depicted in FIG. 14. The angle alfa and frequency freq can be calculated as:

Given: A,B,C,D,res.

$$alfa = alfa1 - alfa2;$$
$$\tan(alfa) = \tan(alfa1 - alfa2);$$
$$= (\tan(alfa1) - \tan(alfa2))/(1.0 + \tan(alfa1)*\tan(alfa2));$$
$$= (A/B - C/D)/(1.0 + AC/BD);$$
$$= (AD - BC)/(BD + AC);$$

thus: $alfa = \arctan((AD - BC)/(BD + AC))$.
$freq = res*\sqrt{(CC + DD)/TS}; TS*TS = A*A + B*B;$
thus: $freq = res*\sqrt{((CC + DD)/(AA + BB))}$.

By having two degrees of freedom to control the angle of the reproduced screen, it is possible to obtain many more angles, or to achieve a much better approximation in achieving a specified angle. This is demonstrated with an example:
res=2400 dpi; A=160; B=280; C=5; D=19;

alfa=15.0013 degrees;
freq=146.2138 1/i.
Although this method has an advantage on its own, in the sense that with relatively small tiles better angular accuracy can be obtained than with the "super cell" approach (because of the availability of two degrees of freedom), it is primary useful to rotate a set of three tiles that are already Moire free by themselves.

Indeed, a set of three rational tangent screens that are matched to have no second order Moire, can be generated, as explained above, from the same tilesize. If they have the same tilesize, all three can be rotated by the same amounts with the method as explained in FIG. 14, and therefore, they will keep the same relative angles and their rulings will change by the same constant factor. The result is that, starting from the geometry of one set of matched tiles, a whole family of screening combinations can be generated in small angular increments. This is demonstrated with the following example:
Given: res=2400 dpi; C1=4; D1=15; C2=11; D2=11; C3=15; D3=4;

set 1: A=0; B=280;
screen1: angle1=14.9314 degrees; freq1=133.0644 1/i;
screen2: angle2=45.0000 degrees; freq2=133.3401 1/i;
screen3: angle3=75.0686 degrees; freq3=133.0644 1/i;

set 2: A=1; B=280; (all angles increased by 0.2046 degrees)
screen1: angle1=15.1360 degrees; freq1=133.0635;
screen2: angle2=45.2046 degrees; freq2=133.3393;
screen3: angle3=75.2732 degrees; freq3=133.0635;

set 3: A=2; B=280; (all angles increased by 0.4092 degrees)
screen1: angle1=15.3407 degrees; freq1=133.0610;
screen2: angle2=45.4092 degrees; freq2=133.3367;
screen3: angle3=75.4778 degrees; freq3=133.0610;

and so on . . . (up to +7.5 degrees or down to −7.5 degrees).

Each of the above screen sets is free from second order Moire, since the original set (set 1) is free from Moire, and since all three screens are rotated by exactly the same angle, and since the rulings are all changed by the same constant factor.

Because of the internal 30 degree symmetry of a screen set, there is no need to rotate it by more than ±7.5 degrees. A 7.5 degree rotation would correspond to a change of the rulings by a factor of:
cos(7.5)=0.991 (less than 1% change).

The significance of this procedure is that by starting from a Moire free set of rational tangent screens, a complete range of rotated screen sets can be obtained in small angular increments, and with nearly the same rulings.

Figure 15:
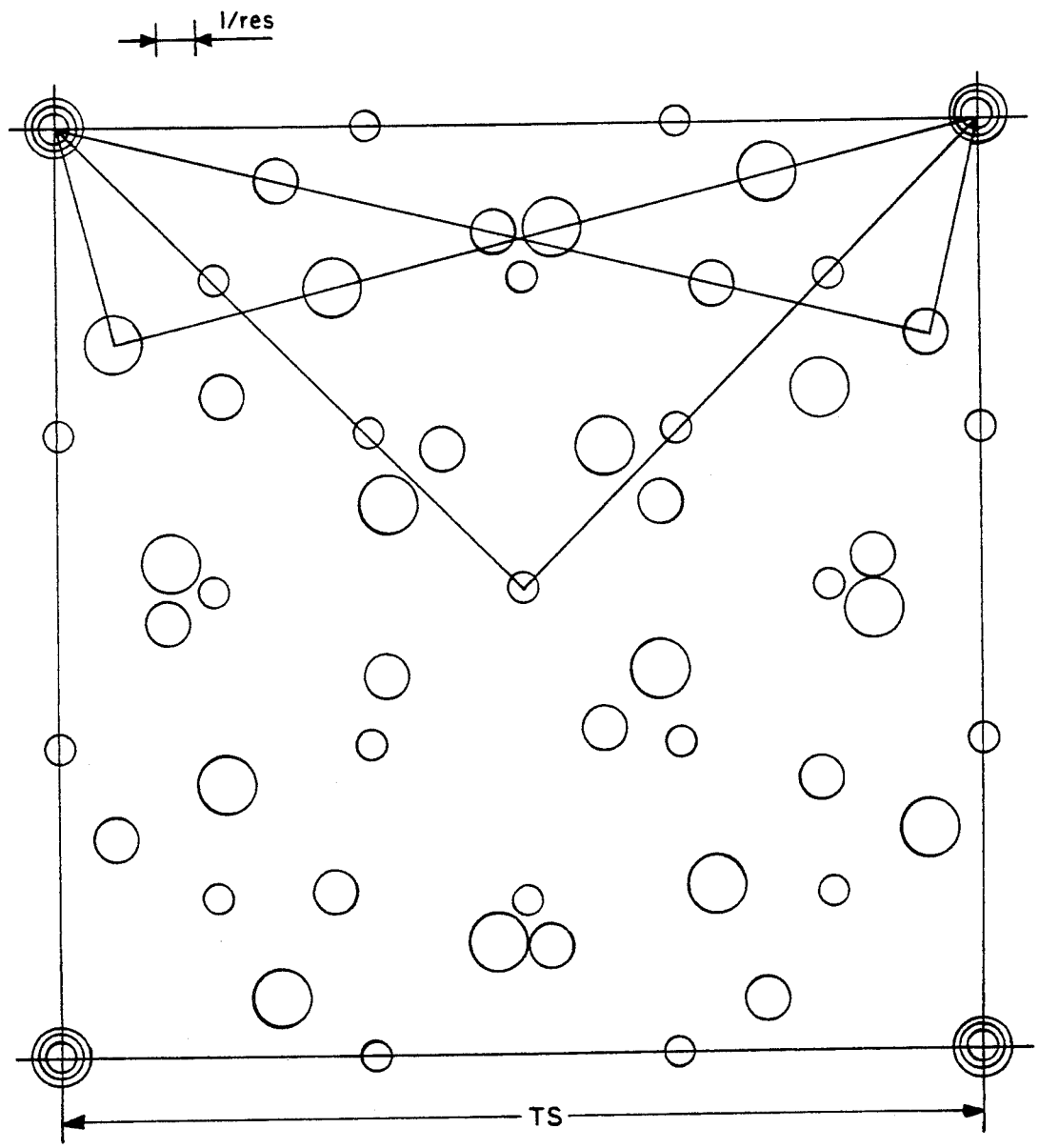
FIG. 15 illustrates the overlay of the "15", "45" and "75" degree screens of the present invention using the same "tile" size; and, FIG. 16 illustrates the use of the 15, 45 and 75 degree screens having the same tile size to "lock" the screens with respect to each other so that there is no accumulation of relative position error with a concomittant consistent rosette across the printed reproduction.
Figure 16:
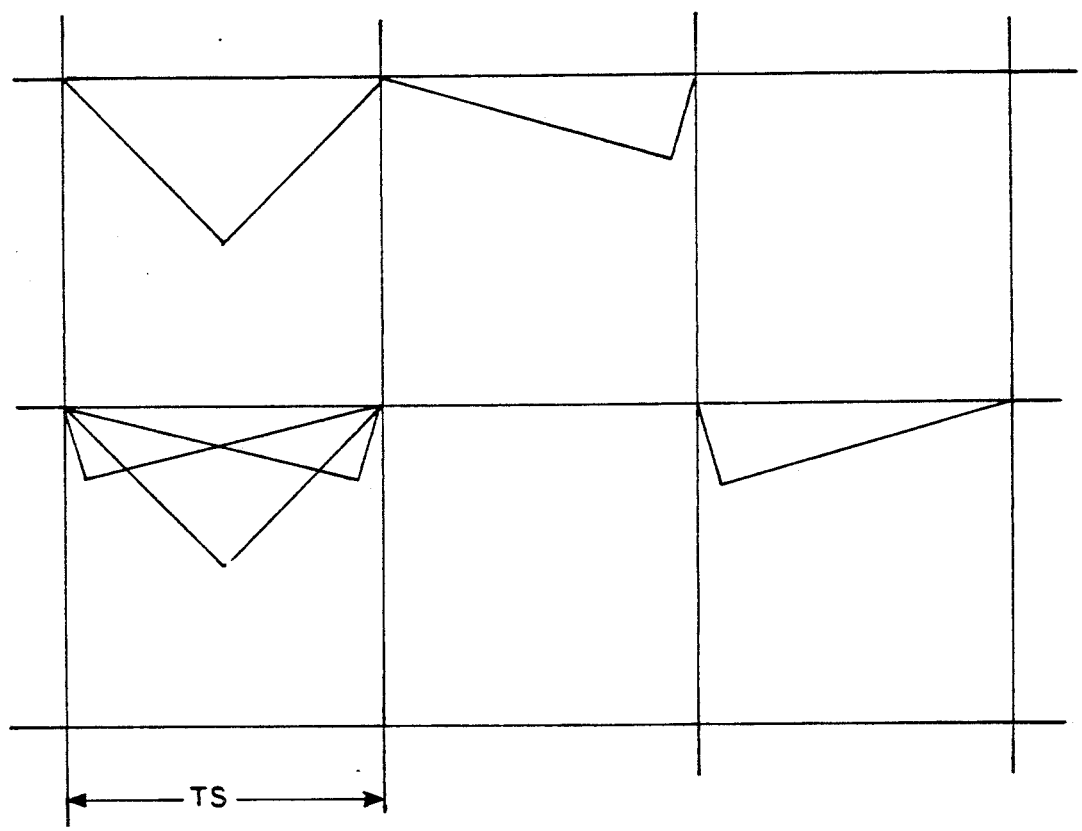

Referring now to FIG. 15, there is shown an overlay of the 15, 45 and 75 degree screens having the same "tile size". It will be appreciated that the preangled dot geometry of one of the screens corresponds to that shown in FIG. 12. Since the three screens use the same tile size, they remain "locked" with respect to each other as shown in FIG. 16. Under the "locked" condition, there is no accumulation of relative position error and, therefore, the rosette remains consistent across the printed page.

Having described in detail a preferred embodiment of the invention, it will now be apparent to those skilled in the art, that numerous modifications can be made therein without departing from the scope of the invention as defined in the following claims:

What I claim is:

1. A screening system for printed reproduction of images comprising first, second and third separation screens having different screen angles and each having rulings with at least two of the screen rulings being different and with at least one vector sum of two frequency components of one pair of screens being equal to at least one frequency component of the other screen or to a multiple or submultiple of said at least one frequency component of the other screen, but not including screens having screen angles that are offset by thirty degrees or a multiple thereof and in which vector lengths of the frequency components are identical.

2. A screening system for printed reproduction of images comprising first, second and third separation screens having different screen angles and each having rulings with at least two of the screen rulings being different and with a multiple of at least one vector sum of two frequency components of one pair of screens being equal to a multiple of at least one frequency component of the other screen, but not including screens having screen angles that are offset by thirty degrees or a multiple thereof and in which vector lengths of the frequency components are identical.

3. A screening system for printed reproduction of images comprising first, second and third separation screens having different screen angles and each having rulings with at least two of the screen rulings being different and with a submultiple of at least one vector sum of two frequency components of one pair of screens being equal to a submultiple of at least one frequency component of the other screen, but not including screens having screen angles that are offset by thirty degrees or a multiple thereof and in which vector lengths of the frequency components are identical.

4. The screening system of claims 1, 2 or 3 wherein the screen angles between any pair of screens are between 29.0 and 31.0 or between 59.0 and 61.0 degrees different.

5. The screening system of claims 1, 2 or 3 wherein the first, second and third separation screens represent colors magenta, cyan and black.

6. The screening system of claims 1, 2 or 3 wherein the first, second and third separation screens represent a same color.

7. The screening system of claims 1, 2 or 3 wherein the first, second and third separation screens represent a tri-tone.

8. The screening system of claims 1, 2 or 3 wherein the screen angles of said first, second and third separation screens are rational tangent angles.

9. The screening system of claims 1, 2 or 3 wherein the screen angle of at least one of said first, second and third separation screens is an irrational tangent angle.

10. The screening system of claims 1, 2 or 3 wherein two of the screen rulings are identical.

11. A method for producing half-tone screen function values comprising the steps of:
    A. generating a rectangular tile having dots that are preangled under a rational tangent angle; and,
    B. sampling said rectangular tile under a different rational tangent angle to produce half-tone screen function values.

* * * * *